US006841846B1

United States Patent
Chen et al.

(10) Patent No.: US 6,841,846 B1
(45) Date of Patent: Jan. 11, 2005

(54) ANTIFUSE STRUCTURE AND A METHOD OF FORMING AN ANTIFUSE STRUCTURE

(75) Inventors: Hung-Sheng Chen, San Jose, CA (US); Huan-Chung Tseng, Saratoga, CA (US); Chang-Kai Huang, Cupertino, CA (US)

(73) Assignee: Actel Corporation, Mountain View, CA (US)

(*) Notice: Subject to any disclaimer, the term of this patent is extended or adjusted under 35 U.S.C. 154(b) by 0 days.

(21) Appl. No.: 10/625,491

(22) Filed: Jul. 22, 2003

(51) Int. Cl.⁷ .............................................. H01L 29/00
(52) U.S. Cl. .................. 257/530; 257/50; 257/209; 257/529; 438/128; 438/131; 438/238; 438/381; 438/398; 438/467
(58) Field of Search .................. 257/50, 209, 309, 257/529, 530; 438/128, 131, 238, 255, 381, 398, 467

(56) References Cited

U.S. PATENT DOCUMENTS

| | | | | |
|---|---|---|---|---|
| 5,641,985 A | * | 6/1997 | Tamura et al. ............... 257/530 |
| 6,154,410 A | | 11/2000 | Cutter et al. .............. 365/225.7 |
| 6,259,130 B1 | | 7/2001 | Wu .............................. 257/314 |
| 6,392,284 B1 | * | 5/2002 | Thakur et al. ............... 257/530 |
| 6,413,833 B2 | | 7/2002 | Yamamoto ................... 438/398 |
| 6,440,869 B1 | | 8/2002 | Tseng .......................... 438/734 |
| 6,458,645 B2 | * | 10/2002 | DeBoer et al. ............. 438/240 |
| 6,605,532 B1 | * | 8/2003 | Parekh et al. ............... 438/637 |
| 2001/0034096 A1 | * | 10/2001 | Thakur ....................... 438/240 |
| 2002/0025650 A1 | * | 2/2002 | Thakur et al. .............. 438/398 |
| 2003/0003632 A1 | * | 1/2003 | Cleeves et al. ............. 438/131 |
| 2003/0113968 A1 | * | 6/2003 | Thakur ....................... 438/253 |

OTHER PUBLICATIONS

H. Watanabe et al., "An Advanced Technique for Fabricating Hemispherical–Grained (HSG) Silicon Storage Electrodes", *IEEE Transactions On Electron Devices*, vol. 42, No. 2, pp. 295–300, Feb. 1995.

* cited by examiner

*Primary Examiner*—Tom Thomas
*Assistant Examiner*—N. Drew Richards
(74) *Attorney, Agent, or Firm*—Sierra Patent Group, Ltd.

(57) ABSTRACT

The present invention comprises an antifuse having a hemispherical grained (HSG) layer and a method of forming antifuse having a hemispherical grained (HSG) layer. The antifuse of the present invention comprises a plurality of layers, the first being a lower electrode that is disposed on an impurity region in a semiconductor substrate. A dielectric layer is disposed on the lower electrode, wherein the dielectric layer has a planar surface. A non-conductive hemispherical grain (HSG) layer is formed on the planar surface of the dielectric layer and an upper electrode is disposed on said non-conductive hemispherical grain (HSG) layer forming the antifuse.

24 Claims, 3 Drawing Sheets

ANTIFUSE STRUCTURE AND A METHOD OF FORMING AN ANTIFUSE STRUCTURE

BACKGROUND

The present disclosure relates to antifuse structures and methods of forming antifuse structures, and in particular, to the use of hemispherical grained silicon or amorphous silicon as part of an inter-electrode dielectric in an antifuse.

FPGAs are known in the art. An FPGA comprises an interconnect routing architecture and programmable elements that may be programmed to selectively interconnect the logic modules to one another and to define the functions of the logic modules. To implement a particular circuit function, the circuit is mapped into the array and the appropriate programmable elements are programmed to implement the necessary wiring connections that form the user circuit.

An FPGA may also include other components, such as static random access memory (SRAM) blocks or dynamic random access memory (DRAM) arrays. Horizontal and vertical routing channels provide interconnections between the various components within an FPQA. Programmable connections are provided by programmable elements between the routing resources.

An FPGA can be programmed to implement virtually any set of digital functions by programming the programmable elements to implement the desired digital functions. There are several different types of programmable elements used in FPGAs, for example, MOS transistors and antifuse elements.

Antifuses may be used in FPGAs for programming purposes and as a mechanism for changing the operating mode. Antifuses may also be programmed to encode identification information about the FPGA, such as when the FPGA was fabricated. In addition, antifuses may be used as non-volatile programmable memory elements to store logic states in memories for row and column redundancy implementation. For example, antifuses for redundancy implementation on a DRAM are usually constructed in the same manner as the memory cell capacitors in a DRAM array. When programmed, an antifuse creates a short circuit or low resistance link, thereby enabling the particular redundant row, column or memory location.

FPGAs can contain hundreds to thousands of antifuses that may or may not need to be programmed. Therefore, it can take a large amount of time to program the antifuses in an FPGA. An unprogrammed antifuse essentially functions as a capacitor. For this reason, an antifuse having a reduced capacitance and low leakage, while maintaining low programming voltages would be beneficial.

However, improving the programming voltage on an antifuse (e.g., by decreasing the thickness of the dielectric or the size of the electrodes) can increase current leakage across the unprogrammed antifuse due to the smaller area occupied by it and thinner dielectric employed in it. Hence, an antifuse having a significantly reduced leakage current while maintaining reduced capacitance would also be beneficial.

SUMMARY

The present invention comprises an antifuse having a hemispherical grained (HSG) layer and a method of forming antifuse having a HSG layer. The antifuse of the present invention comprises a plurality of layers. A first layer comprises a lower electrode. A dielectric layer is disposed on the lower electrode, wherein the dielectric layer has a planar surface. A non-conductive HSG layer is formed on the planar surface of the dielectric layer and an upper electrode is disposed on said non-conductive HSG layer forming the antifuse.

A better understanding of the features and advantages of the present invention will be obtained by reference to the following detailed description of the invention and accompanying drawings, which set forth an illustrative embodiment in which the principles of the invention are utilized.

BRIEF DESCRIPTION OF THE DRAWINGS

Referring now to the figures, wherein like elements are numbered the same.

DETAILED DESCRIPTION

Those of ordinary skill in the art will realize that the following description of the present invention is illustrative only and not in any way limiting. Other embodiments of the invention will readily suggest themselves to such skilled persons.

In the present disclosure, Vcc is used to define the power supply for the digital circuit as designed. As one of ordinary skill in the art will readily recognize, the size of a digital circuit may vary greatly depending on a user's particular circuit requirements. Thus, the Vcc may change depending on the size of the circuit elements used.

Figure 1:
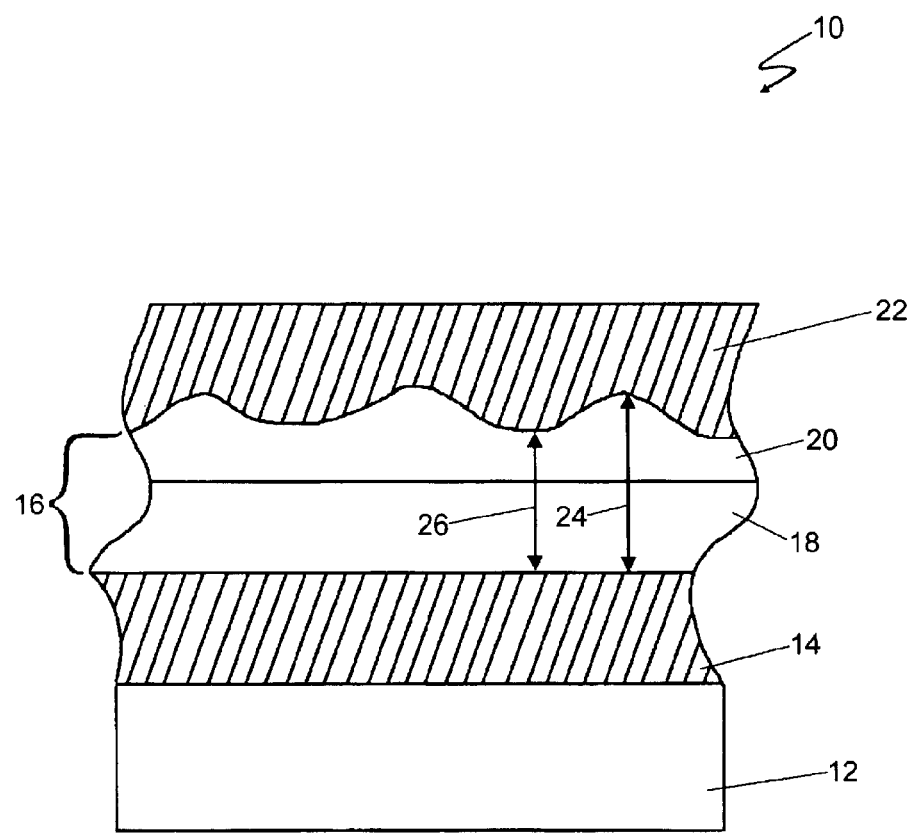
FIG. 1 is a simplified cross-sectional diagram of an antifuse.

FIG. 1 is a simplified cross-sectional diagram of an antifuse 10. Antifuse 10 includes a lower electrode 14 that is formed on an impurity region (not shown) in a semiconductor substrate 12. Lower electrode 14 can comprise a planar polysilicon layer formed on top of and in electrical contact with the impurity region. A dielectric element (or layer) 16 comprises a planar dielectric layer 18 and a layer of hemispherical grained (HSG) amorphous polysilicon 20. Disposed on top of HSG amorphous polysilicon layer 20 is an upper electrode 22.

The antifuse 10 utilizes the HSG amorphous polysilicon layer 20 as part of the dielectric layer. The HSG amorphous polysilicon is typically referred to as "HSG amorphous poly" or "roughened amorphous poly". The HSG amorphous polysilicon layer 20 is a non-conductive polysilicon layer. The HSG amorphous polysilicon layer 20 may also be comprised of germanium (GE). Other materials contemplated include amorphous SiGe and amorphous SiC.

The HSG amorphous polysilicon layer 20 is disposed in a "rough state", that is, the resulting deposition of the HSG amorphous polysilicon layer 20 is uneven (i.e., generally not completely planar). By the nature of the "rough" surface of the HSG amorphous polysilicon layer 20, the thickness of dielectric element 16 is varied. The thickness of the dielectric element 16 can vary from about 100 Angstroms (Å) to about 300 Å. The thickness of the planar dielectric layer 18 is from about 5 Å to about 200 Å. The thickness of the HSG amorphous polysilicon layer 20 is from about 100 Å to about 500 Å.

An example of the possibility of having a varying degree of thicknesses is illustrated in FIG. 1. Arrow 24 illustrates one example of a thickness that is less than the thickness represented by arrow 26.

As those of ordinary skill in the art will readily recognize, the thickness of both the dielectric layer 18 and the HSG amorphous polysilicon layer 20 can vary depending on the desired circuit performance requirements. The above thicknesses are presented for illustrative purposes only and are not meant to limit the present disclosure.

By increasing the thickness of dielectric element 16 with HSG amorphous polysilicon layer 20, a reduced capacitance will result in the antifuse 10. This result is due to the capacitance being inversely proportional to the distance between the lower electrode 14 and the upper electrode 22. Depending on the thickness of dielectric element 16 at the program path (i.e., arrow 24, for illustrative purposes only), up to about 30% capacitance reduction can be achieved.

Current leakage may also be reduced as compared to prior art antifuses due to the reduced defect density. The defect density can be increased with a decrease in the dielectric layer. Due to the HSG layer, the average thickness of the dielectric is increased and the effect of the defect on leakage current is decreased. The capacitance reduction is directly attributed to the portion of the dielectric element 16 represented by arrow 26, which is demonstrated in the following example:

The dielectric layer of the antifuse has a thickness of about 5 Å to about 200 Å, with a preferred thickness of about 20 Å to about 100 Å, and a more preferred thickness of about 40 Å to about 60 Å. The amorphous HSG layer has a thickness of about 100 Å to about 500 Å, with a preferred thickness of about 200 Å to about 400 Å and a more preferred thickness of about 300 Å.

Figure 2:
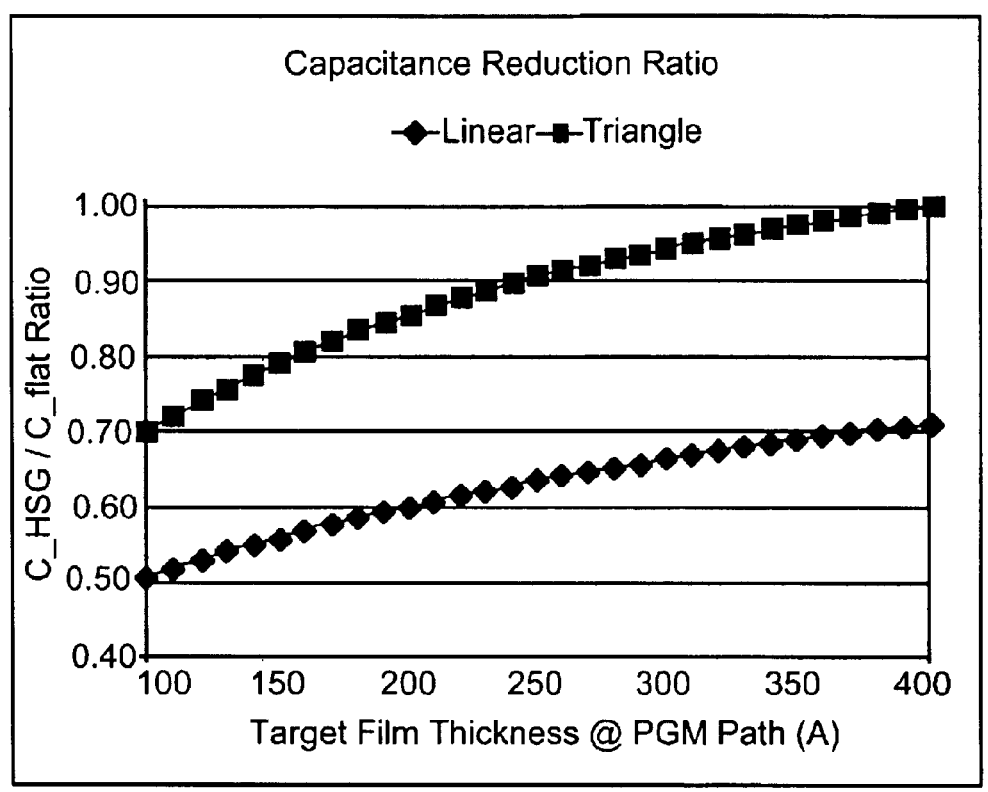
FIG. 2 is a simplified graph illustrating the capacitance reduction ratio of the antifuse of FIG. 1.

FIG. 2 is a simplified graph illustrating, the estimated capacitance reduction ratio of the antifuse of FIG. 1. The estimated capacitance reduction ratio is based on known linear and triangular approximation theories used for calculating the thickness of dielectric element 16 having a HSG amorphous polysilicon layer 20, as illustrated in FIG. 1.

In addition, as one of ordinary skill in the art will recognize, when programming antifuse 10, the current will flow through dielectric element 16 at a thinner point, represented by arrow 24. Thus, the programming time is not affected by the increased thickness of the dielectric layer and reduced capacitance. Moreover, the programming voltage is low due to the thinner point, represented by arrow 24. The antifuse can be programmed utilizing known methods.

Figure 3:
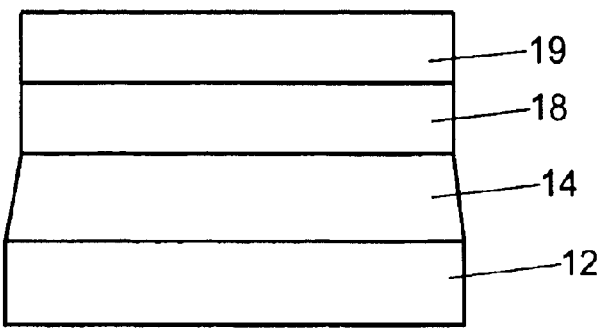
FIG. 3 is a cross-sectional diagram illustrating the steps of forming a lower electrode, a dielectric layer, and an amorphous silicon layer on a substrate.
Figure 4:
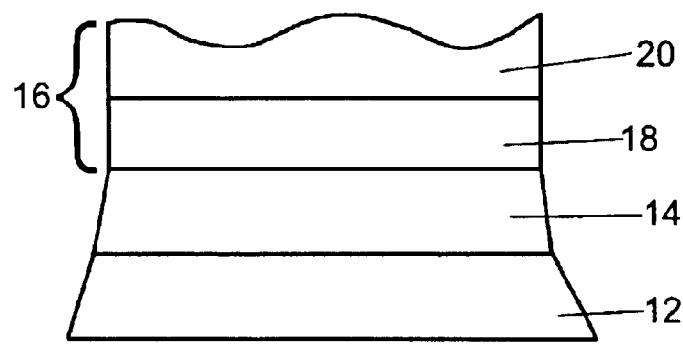
FIG. 4 is a cross-sectional diagram illustrating the steps of forming an amorphous silicon hemispherical grain layer on the layers of FIG. 3.
Figure 5:
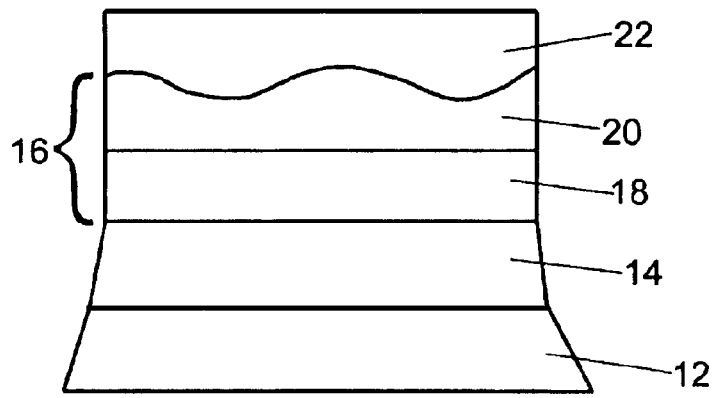
FIG. 5 is a cross-sectional diagram illustrating the steps of forming an upper electrode layer on the layers of FIG. 4.

FIGS. 3, 4, and 5 illustrate the steps of forming an antifuse. As illustrated in FIG. 3, a lower electrode 14 is formed on an impurity region (not shown) in a non-conductive semiconductor substrate 12. The lower electrode 14 may be formed of a planar polysilicon layer formed on lop of and in electrical contact with an impurity region. The lower electrode 14 may also be formed of a planar metal layer, such as TiN, Ti, TaN, W, or TiW.

A planar dielectric layer 18 is disposed over the lower electrode 14. The dielectric layer 18 may be formed of a material such as silicon dioxide, silicon nitride, and the like. In some instances, the planar dielectric layer 18 may be omitted. In the preferred embodiment, an amorphous silicon layer 19 is deposited on the dielectric layer 18.

As illustrated in FIG. 4, a layer of HSG amorphous polysilicon 20 is then formed from the amorphous silicon layer 19 using a vacuum anneal process. A dielectric element 16 comprising the planar dielectric layer 18 and the HSG amorphous polysilicon layer 20 is formed.

HSG may be formed on an amorphous carbon layer. The amorphous carbon layer can be doped with hydrogen, fluorine, or hydrogen and fluorine. The HSG amorphous carbon layer can be disposed between two layers of an adhesion-promoting material. In some cases, a dielectric layer may also be disposed with the HSG amorphous carbon layer between two layers of an adhesion-promoting material. Such an adhesion-promoting material can be SiC, SiN, and the like.

Generally, the dielectric element 16 can be formed using a fabrication method that comprises forming a layer of HSG amorphous polysilicon 20 on a dielectric layer 18 or, when a dielectric layer 18 is not utilized, on an impurity region or metal layer 14. Once the amorphous polysilicon layer 19 is deposited, the native oxide is removed. Finally, the amorphous polysilicon layer 19 is subjected to high-vacuum annealing and the HSG amorphous polysilicon layer 20 is formed. Other methods may be used to form HSG amorphous polysilicon layer 20, such as low-pressure chemical vapor deposition (LVCPD) and in-situ annealing under an ultrahigh vacuum.

As illustrated in FIG. 5, an upper electrode is disposed on the HSG amorphous polysilicon layer 20. The upper electrode 22 may be formed of a planar polysilicon layer formed on top of and in electrical contact with an impurity region. The electrode 22 may also be formed of a planar metal layer, such as TiN, Ti, TaN, W, or TiW.

While embodiments and applications of this system have been shown and described, it would be apparent to those skilled in the art that many more modifications than mentioned above are possible without departing from the inventive concepts herein. The invention, therefore, is not to be restricted except

What is claimed is:

1. An antifuse, comprising:
   a lower electrode layer;
   a dielectric layer disposed on said lower electrode layer;
   a non-conductive hemispherical grain layer formed on said dielectric layer; and
   an upper electrode disposed on said non-conductive hemispherical grain layer.

2. The antifuse of claim 1, wherein said dielectric layer is disposed in physical communication with said non-conductive hemispherical grain layer and said lower electrode layer.

3. The antifuse of claim 1, wherein said dielectric layer has at least one planar surface.

4. The antifuse of claim 1, wherein said non-conductive hemispherical grain layer comprises amorphous Si.

5. The antifuse of claim 1, wherein said non-conductive hemispherical grain layer comprises amorphous SiGe.

6. The antifuse of claim 1, wherein said non-conductive hemispherical grain layer comprises amorphous carbon.

7. The antifuse of claim 6, wherein said amorphous carbon of said non-conductive hemispherical grain layer is doped with at least one of hydrogen and fluorine.

8. The antifuse of claim 1, wherein said non-conductive hemispherical grain layer is disposed between two layers of an adhesion-promoting material.

9. The antifuse of claim 1, wherein said dielectric layer and said nonconductive hemispherical grain layer form a dielectric element.

10. The antifuse of claim 9, wherein said dielectric element is about 5 Å to about 200 Å in thickness.

11. The antifuse of claim 1, wherein said non-conductive hemispherical grain layer is about 100 Å to about 500 Å in thickness.

12. A method of forming an antifuse, comprising:

disposing a dielectric layer on a lower electrode layer;

forming a non-conductive hemispherical grain layer on said dielectric layer; and disposing an upper electrode on said non-conductive hemispherical grain layer.

13. The method of claim 1, wherein said dielectric layer is in physical communication with said non-conductive hemispherical grain layer and said lower electrode layer.

14. The method of claim 12, wherein said dielectric layer has at least one planar surface.

15. The method of claim 12, wherein said non-conductive hemispherical grain layer comprises amorphous Si.

16. The method of claim 12, wherein said non-conductive hemispherical grain layer comprises amorphous SiGe.

17. The method of claim 12, wherein said non-conductive hemispherical grain layer comprises amorphous carbon.

18. The method of claim 17, wherein said amorphous carbon of said non-conductive hemispherical grain layer is doped with at least one of hydrogen and fluorine.

19. The method of claim 12, wherein said non-conductive hemispherical grain layer is disposed between two layers of an adhesion-promoting material.

20. The method of claim 12, wherein said dielectric layer and said nonconductive hemispherical grain layer form a dielectric element.

21. The method of claim 20, wherein said dielectric element is about 5 Å to about 200 Å in thickness.

22. The method of claim 12, wherein said non-conductive hemispherical grain layer is about 100 Å to about 500 Å in thickness.

23. The method of claim 12, wherein said forming said non-conductive hemispherical grain layer includes vacuum annealing said non-conductive hemispherical grain layer.

24. The method of claim 12, wherein said forming said non-conductive hemispherical grain layer includes use of a process selected from the group consisting of a vacuum anneal process, a low-pressure chemical vapor deposition process, and an in-situ annealing process.

* * * * *